(12) United States Patent
Hilkene et al.

(10) Patent No.: US 8,354,035 B2
(45) Date of Patent: Jan. 15, 2013

(54) METHOD FOR REMOVING IMPLANTED PHOTO RESIST FROM HARD DISK DRIVE SUBSTRATES

(75) Inventors: Martin A. Hilkene, Gilroy, CA (US); Majeed A. Foad, Sunnyvale, CA (US); Matthew D. Scotney-Castle, Morgan Hill, CA (US); Roman Gouk, San Jose, CA (US); Steven Verhaverbeke, San Francisco, CA (US); Peter I. Porshnev, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 391 days.

(21) Appl. No.: 12/821,400

(22) Filed: Jun. 23, 2010

(65) Prior Publication Data

US 2011/0006034 A1 Jan. 13, 2011

Related U.S. Application Data

(60) Provisional application No. 61/225,046, filed on Jul. 13, 2009.

(51) Int. Cl.
*B44C 1/22* (2006.01)
(52) U.S. Cl. ........................................................ 216/22
(58) Field of Classification Search ...................... 216/22
See application file for complete search history.

(56) References Cited

U.S. PATENT DOCUMENTS

| | | | |
|---|---|---|---|
| 5,160,404 A | 11/1992 | Motoyama | |
| 5,824,604 A | 10/1998 | Bar-Gadda | |
| 6,024,887 A | 2/2000 | Kuo et al. | |
| 6,526,996 B1 | 3/2003 | Chang et al. | |
| 6,680,164 B2 | 1/2004 | Nguyen et al. | |
| 6,683,008 B1 | 1/2004 | Cotte et al. | |
| 6,693,043 B1 | 2/2004 | Li et al. | |
| 7,001,848 B1 | 2/2006 | Smith et al. | |
| 2003/0170985 A1 | 9/2003 | Hwang et al. | |
| 2003/0180968 A1 | 9/2003 | Nallan et al. | |
| 2005/0227378 A1 | 10/2005 | Moise et al. | |
| 2006/0012904 A1* | 1/2006 | Naruse et al. | 360/48 |
| 2007/0054492 A1 | 3/2007 | Elliott et al. | |
| 2008/0149135 A1 | 6/2008 | Cho et al. | |
| 2008/0153306 A1 | 6/2008 | Cho et al. | |
| 2008/0210273 A1 | 9/2008 | Joe | |
| 2008/0254639 A1 | 10/2008 | Graff | |
| 2009/0162704 A1 | 6/2009 | Kimura et al. | |
| 2010/0053813 A1 | 3/2010 | Fukushima et al. | |

FOREIGN PATENT DOCUMENTS

WO  WO-2009017016 A1  2/2009

OTHER PUBLICATIONS

International Search Report and Written Opinion Mailed Jan. 27, 2011, in International Application No. PCT/US2010/039531.

* cited by examiner

*Primary Examiner* — Roberts Culbert
(74) *Attorney, Agent, or Firm* — Patterson & Sheridan, LLP

(57) ABSTRACT

A method of removing resist material from a substrate having a magnetically active surface is provided. The substrate is disposed in a processing chamber and exposed to a fluorine-containing plasma formed from a gas mixture having a reagent, an oxidizing agent, and a reducing agent. A cleaning agent may also be included. The substrate may be cooled by back-side cooling or by a cooling process wherein a cooling medium is provided to the processing chamber while the plasma treatment is suspended. Substrates may be flipped over for two-sided processing, and multiple substrates may be processed concurrently.

19 Claims, 4 Drawing Sheets

METHOD FOR REMOVING IMPLANTED PHOTO RESIST FROM HARD DISK DRIVE SUBSTRATES

CROSS-REFERENCE TO RELATED APPLICATIONS

This application claims benefit of U.S. Provisional Patent Application Ser. No. 61/225,046, filed Jul. 13, 2009, which is incorporated herein by reference.

FIELD

Embodiments of the invention generally relate to manufacturing of magnetically active substrates. More specifically, embodiments disclosed herein relate to patterning of magnetically active substrates.

BACKGROUND

Magnetically active materials are used for many applications in the electronics industry. Layers of magnetically active material are incorporated into disks used for hard disk drives and into magnetic (or magnetoresistive) random access memory (MRAMs) chips. Each of these applications requires a layer of magnetic material to be formed on a substrate and then patterned with domains that can be separately magnetized or demagnetized.

The disk in a hard-disk drive is configured with magnetic domains that are separately addressable by a magnetic head. The magnetic head moves into proximity with a magnetic domain and alters the magnetic properties of the domain to record information. To recover the recorded information, the magnetic head moves into proximity with the domain and detects the magnetic properties of the domain. The magnetic properties of the domain are generally interpreted as corresponding to one of two possible states, the "0" state and the "1" state. In this way, digital information may be recorded on the magnetic medium and recovered thereafter.

The magnetic medium in a hard-disk drive is generally a glass, composite glass/ceramic, or metal substrate, which is generally non-magnetic, with a magnetically susceptible material deposited thereon. The magnetically susceptible layer is generally deposited to form a pattern, such that the surface of the disk has areas of magnetic susceptibility interspersed with areas of magnetic inactivity. The non-magnetic substrate is usually topographically patterned, and the magnetically susceptible material deposited by spin-coating or electroplating. The disk may then be polished or planarized to expose the non-magnetic boundaries around the magnetic domains. In some cases, the magnetic material is deposited in a patterned way to form magnetic grains or dots separated by a non-magnetic area.

Such methods are expected to yield storage structures capable of supporting data density up to about 1 TB/in$^2$, with individual domains having dimensions as small as 20 nm. Where domains with different spin orientations meet, there is a region referred to as a Bloch wall in which the spin orientation goes through a transition from the first orientation to the second. The width of this transition region limits the areal density of information storage because the Bloch wall occupies an increasing portion of the total magnetic domain.

To overcome the limit due to Bloch wall width in continuous magnetic thin films, the domains can be physically separated by a non-magnetic region, which can be narrower than the width of a Bloch wall in a continuous magnetic thin film. Conventional approaches to creating discrete magnetic and non-magnetic areas on a medium have focused on forming single bit magnetic domains that are completely separate from each other, either by depositing the magnetic domains as separate islands or by removing material from a continuous magnetic film to physically separate the magnetic domains. In some processes, a substrate is masked and patterned, and a magnetic material deposited over unmasked portions of the substrate. In other processes, magnetic material is deposited on a substrate before masking and patterning, and is then etched away in exposed portions. In either case, the topography of the substrate is altered by deposition or etching of the residual pattern of the magnetic regions. Because the read-write head of a typical hard-disk drive may fly as close as 2 nm from the surface of the disk, these topographic alterations can become limiting. Thus, there is a need for a process or method of patterning magnetic media that has high resolution and does not alter the topography of the media, and an apparatus for performing the process or method efficiently for high volume manufacturing.

SUMMARY

Embodiments disclosed herein provide a method of removing a resist layer from a magnetically active substrate by providing a gas mixture having a fluorine-containing reagent gas, an oxidizing gas, and a reducing gas to a processing chamber, forming an inductive plasma from the gas mixture by applying RF, pulsed DC, or microwave energy to the gas mixture, and etching the resist layer by immersing the magnetically active substrate in the plasma.

Other embodiments provide a method of processing a substrate having a magnetically active layer and a resist layer contacting the magnetically active layer by applying RF, pulsed DC, or microwave energy to a gas mixture comprising fluorine to form a plasma, and exposing the resist layer to the plasma while maintaining the magnetic characteristics of the magnetically active layer in a substantially unchanged state.

Still other embodiments provide a method of processing a substrate in a processing chamber, the substrate having a magnetically active layer and a resist layer disposed thereon, by implanting ions into the magnetically active layer and the resist layer, performing a resist removal process on the substrate by immersing the substrate in a plasma containing one or more of fluorine and nitrogen, applying a bias energy between about 0 W and about 100 W to the substrate, discontinuing the plasma and purging the processing chamber, exposing the substrate to a non-reactive gas at a second pressure greater than the first pressure, purging the non-reactive gas from the processing chamber, and repeating the resist removal process until the resist layer is removed, and exposing the substrate to a cleaning agent, wherein the implanting, repeated resist removal process, and exposure to the cleaning agent are performed in the same processing chamber.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The invention generally provides methods for treating substrates having magnetic activity. The substrates are formed by applying magnetically active layers to one or more supporting layers, and then forming a pattern of magnetic characteristics, such as magnetic susceptibility or coercivity, or magnetic field strength, in the magnetically active layers. In some embodiments, the magnetic pattern is formed by applying a patterned resist to the substrate and implanting ions in the magnetically active layers. The patterned resist may expose portions of the magnetically active layer and cover other portions, or the patterned resist may have thick portions and thin portions. In either embodiment, the thick portions of the resist prevent ions from reaching the magnetically active layers while ions penetrate the thin portions of the resist or impinge the exposed portions of the magnetically active layers. The ions implant in the desired areas of the magnetic layers, as defined by the resist pattern, changing the magnetic characteristics of the implanted areas. Ions may be implanted by a plasma process or by ion beam implantation. In alternate embodiments, cluster ions or neutral particles may also be implanted with similar results.

The patterned resist layer is generally removed from the substrate following implantation. In many embodiments, the patterned resist layer comprises carbon and hydrogen, and following implantation may also comprise dopants. Implantation generally breaks carbon-hydrogen bonds and forms carbon-carbon bonds, giving rise to diamond-like domains in the resist layer that are generally more resistant to standard stripping and ashing processes than graphitic domains. The resist layer is therefore removed using a reactive plasma process that breaks the carbon-carbon bonds, but leaves the magnetic characteristics of the underlying magnetically active layers substantially unchanged.

The plasma process comprises exposing the substrate to a plasma comprising elements from the group consisting of fluorine and nitrogen, and reacting the plasma with the resist layer to form volatile compounds, which are removed from the processing chamber. The plasma process may be performed in the same chamber as the implantation process, or in a different chamber coupled to the same vacuum system. It is generally preferred that the substrate not be exposed to air or oxygen between the implantation process and the resist removal process.

Figure 1:
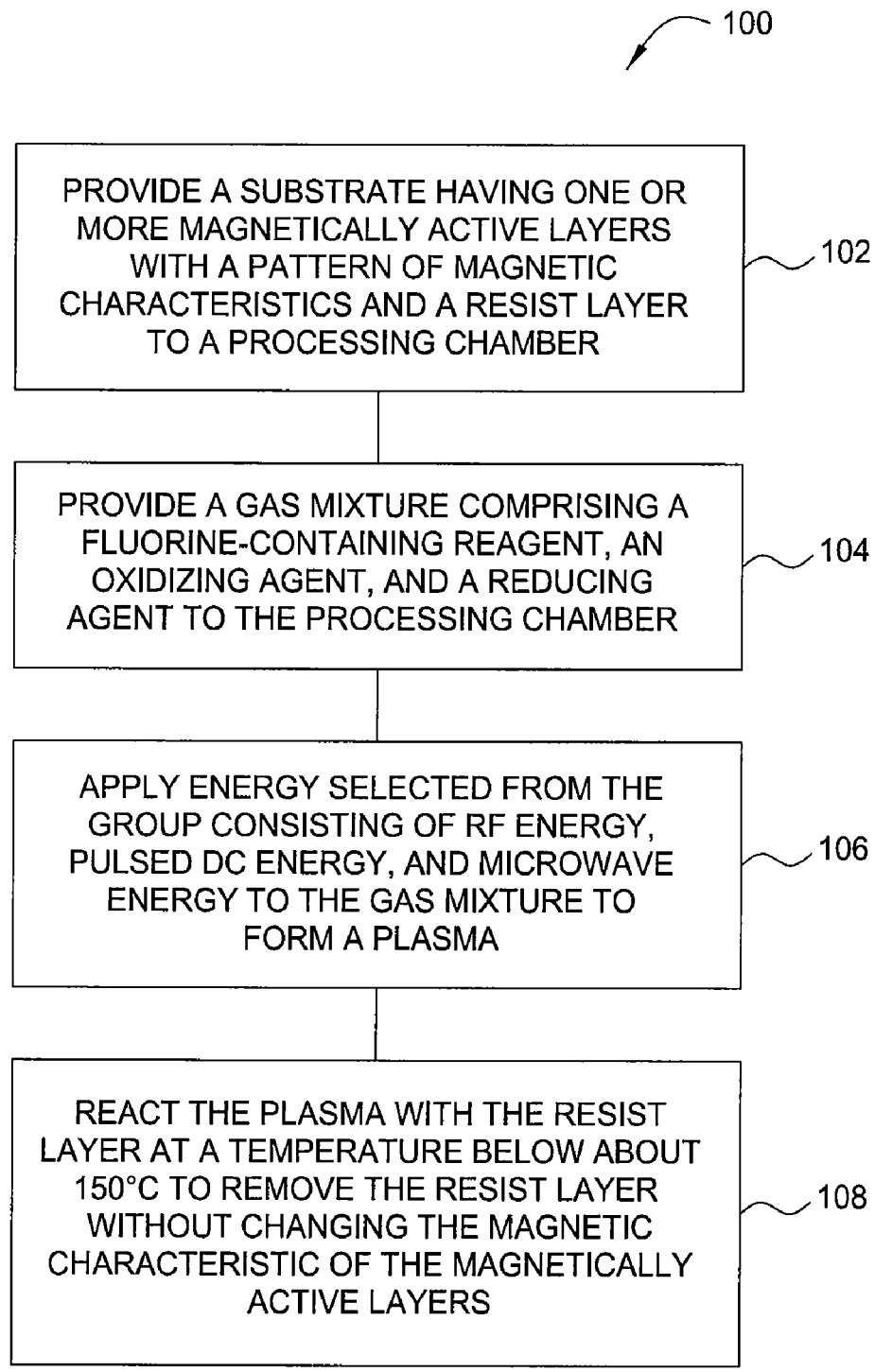
FIG. 1 is a flow diagram summarizing a method according to one embodiment.

FIG. 1 is a flow diagram summarizing a method 100 according to one embodiment. A substrate having one or more magnetically active layers with a pattern of magnetic characteristics and a resist layer is disposed in a processing chamber at 102. The magnetically active layers of the substrate may have been subjected to an ion implantation process to form the pattern of magnetic characteristics, during which process the resist layer would also have been implanted with dopants. At 104, a gas mixture is provided to a processing chamber, and energy is applied to the gas mixture to form the plasma at 106. At 108, the plasma is allowed to react with the resist layer at a temperature below about 150° C. The reaction etches the resist layer without changing the magnetic characteristics of the magnetically active layers. The plasma may be generated in the processing chamber in which the substrate to be treated has been positioned, or in a remote plasma chamber and delivered to the processing chamber. For direct or in situ plasma embodiments, the energy source may be RF energy, pulsed DC energy, or microwave energy. For remote plasma embodiments, the energy source is microwave or, preferably, RF energy.

The gas mixture provided to the processing chamber for plasma formation comprises a reagent, an oxidizing agent, and a reducing agent. The reagent is a compound that comprises halogens such as fluorine and chlorine. Exemplary reagents include carbon tetrafluoride ($CF_4$), nitrogen trifluoride ($NF_3$), and silicon tetrafluoride ($SiF_4$). The reagent may also be a mixture or combination of halogen containing compounds, such as the fluorine containing compounds named above, and halogen free compounds or materials, such as carrier gases which may include argon, nitrogen, helium, hydrogen, and the like. The oxidizing agent will generally serve as a source of oxygen in the plasma, and may be oxygen gas ($O_2$), ozone ($O_3$), water vapor ($H_2O$), nitrous oxide ($N_2O$), carbon monoxide (CO), carbon dioxide ($CO_2$), or a mixture or combination thereof. The reducing agent is a compound that comprises hydrogen, such as water vapor ($H_2O$), ammonia ($NH_3$), hydrogen ($H_2$), hydrazine ($N_2H_2$), or hydrazoic acid ($H_3N$), or a mixture or combination thereof. In one embodiment, the gas mixture comprises $CF_4$, $O_2$, and $H_2$. In other examples, $CHF_3$ of $CH_2F_2$ may be substituted for $CF_4$.

The reagent generally provides at least about half the volumetric flow of the gas mixture, and may provide up to about 95% thereof. Depending on specific embodiments, the reagent may provide any volume fraction between about 50% and about 95% of the gas mixture, such as between about 50% and about 90%, or between about 60% and about 90%, or between about 70% and about 90%, or between about 70% and about 80%. The reducing and oxidizing agents are generally provided in about the same volumetric quantity, but the reducing agent may be provided in a volumetric ratio to the oxidizing agent between about 50% and about 150%, depending on the specific embodiment, such as between about 75% and about 125%, for example about 100%, or in a volumetric ratio of about 1:1.

In one embodiment, the reagent is $CF_4$, and the $CF_4$ is provided to the gas mixture at a volume fraction of about 80%. The oxidizing agent is $O_2$ and the reducing agent is $H_2$, which are provided at about equal volumetric flow rates. Thus, in one embodiment, the gas mixture consists essentially of $CF_4$, $H_2$, and $O_2$ provided in volume ratios of about 4:1:1.

In another embodiment, the gas mixture comprises a reagent and an oxidizing agent, an inert gas, or both. The reagent may be a fluorine containing compound, such as a fluorocarbon, for example $CF_4$, and may make up between about 5% and about 50% by volume of the gas mixture. The oxidizing agent is generally an oxygen containing compound, such as those described above, and may make up between about 50% and about 95% by volume of the gas mixture. The inert gas may be a carrier or diluent, such as $N_2$, $H_2$, Ar, or He, and may make up between about 50% and about 95% by volume of the gas mixture. If hydrogen is used as the carrier or diluent gas, the flow of hydrogen as the carrier or diluent gas may be in proportion to the flow of reagent gas as specified above, such that the hydrogen carrier gas serves as the reducing gas for the process. In another embodiment, a fraction of the total hydrogen may be used as carrier gas, with the balance of the hydrogen provided through an alternate pathway.

In one particular embodiment, the gas mixture contains $CF_4$ between about 5% and about 50% by volume, $O_2$ between about 50% and about 95% by volume, and $N_2$ between about 0% and about 50% by volume. In another particular embodiment, the gas mixture contains $CF_4$ between about 5% and about 50% by volume, $O_2$ between about 5% and about 50% by volume, and $H_2O$ between about 50% and about 95% by volume. In another embodiment, the gas mixture contains $CF_4$ between about 5% and about 50% by volumve, $H_2O$ between about 0% and about 50% by volume, and $H_2$ between about 50% and about 95% by volume.

The plasma exposure is generally performed at a chamber pressure below about 1 Torr, such as between about 1 mTorr and about 100 mTorr, for example about 70 mTorr. The energy applied to the gas mixture is generally applied at power levels between about 90 mW/cm$^2$ and about 8 W/cm$^2$, such as between about 1 W/cm$^2$ and about 5.5 W/cm$^2$, for example about 3.5 W/cm$^2$.

Active fluorine species in the plasma penetrate and remove resist material from the substrate. In many embodiments, the resist material becomes hard during prior processing steps. In some embodiments, the resist material to be removed comprises diamond-like carbon. Active fluorine species effectively penetrate the crust of the hardened resist material, while oxygen species accelerate removal of carbon in the resist material. Hydrogen species in the plasma help remove fluorine that may deposit on the surface of the substrate.

To avoid or minimize energetic collision of ions with the magnetic surface of the substrate, the substrate is immersed in the plasma while a low electrical bias, or no bias, is applied to the substrate. In embodiments using a low bias, bias voltage is generally less than about 150 V, such as less than about 100 V, for example less than about 50 V, and bias energy is less than about 500 W, such as less than about 300 W, for example less than about 100 W, such as between about 0 W and about 100 W. The bias energy is selected to increase concentration of reactive species near the substrate surface while keeping collision energy below a threshold value that would cause sputtering of the magnetic surface or realignment of magnetic domains in the surface. Sputtering of the magnetic surface will result in uneven topography, which may reduce device utility because a magnetic head flying over the substrate at an altitude of 2 nm or less may collide with the surface. Realignment of magnetic domains reduces clarity of the pattern of magnetic properties formed in the magnetic surface. Minimizing collision energy also reduces heating of the substrate, which may also realign magnetic domains. Controlling collision energy also controls penetration depth of active species in the resist material. Deep penetration, such as more than about 3 to 4 monolayers below the surface of the resist material, may harden the resist material, making the resist more difficult to remove in subsequent cleaning or removal processes.

The temperature of the substrate is generally controlled to a temperature less than about 150° C. to prevent thermal degradation of the magnetic pattern in the magnetically susceptible layers. In one embodiment, back-side cooling may be employed, wherein a cooling medium is circulated on the back side of the substrate during plasma treatment. For example, cool helium gas may be pumped through openings in the substrate support to cool the back side of the substrate.

Figure 2:
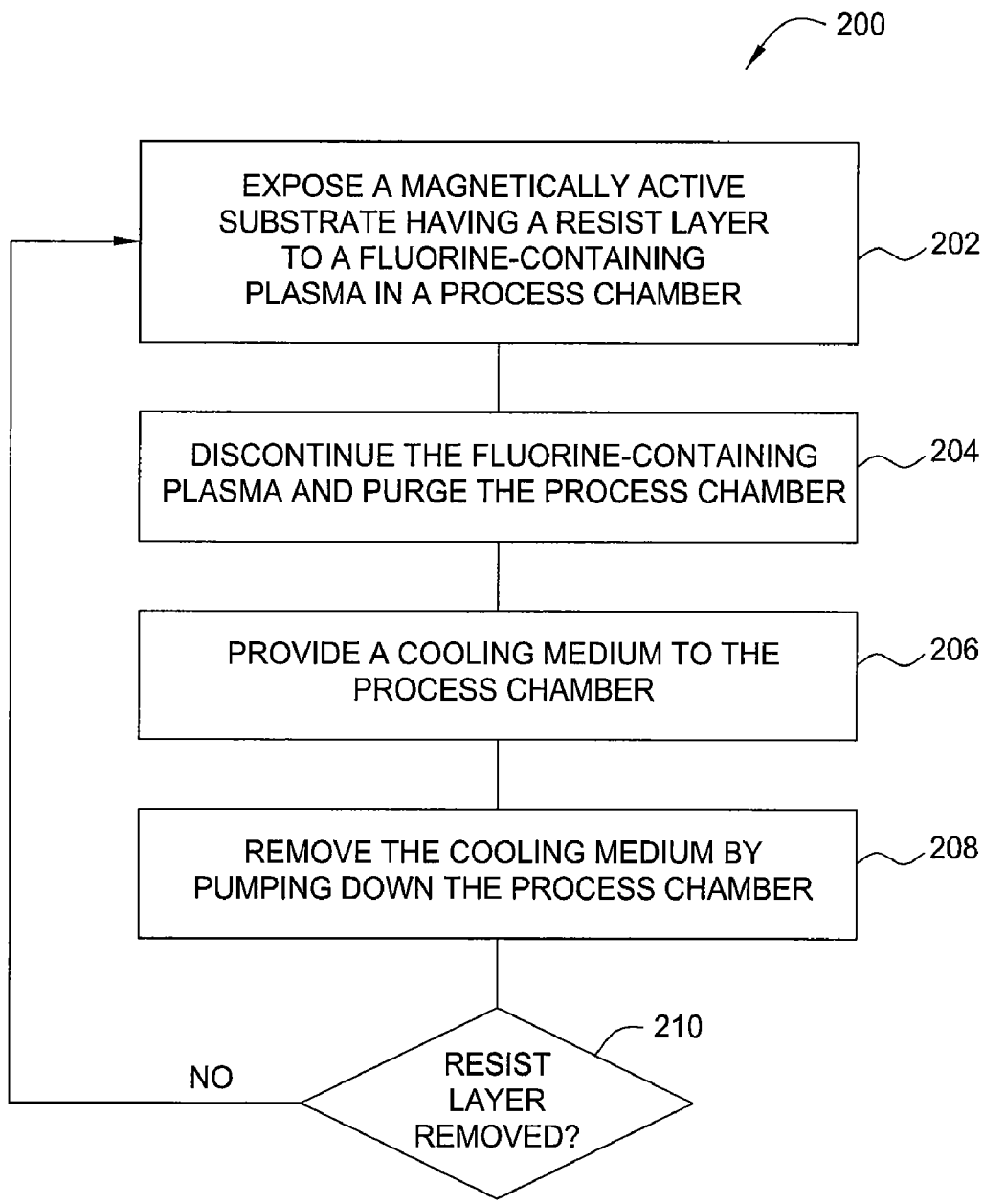
FIG. 2 is a flow diagram summarizing a method according to another embodiment.

FIG. 2 is a flow diagram summarizing a method 200 according to another embodiment. In FIG. 2, a cooling medium is provided to the chamber to cool the substrate. A magnetically active substrate having a resist layer is exposed to a fluorine-containing plasma in a processing chamber at 202. The magnetically active substrate may have been subjected to an ion implantation or plasma immersion process to form a pattern of magnetic characteristics, during which the resist layer would have been hardened. The plasma treatment removes a portion of the hardened resist material. After the plasma treatment, the plasma is discontinued and the gas purged from the chamber at 204. An inert or non-reactive gas is provided to the chamber to serve as a cooling medium at 206. To provide enough mass to perform effective cooling, the chamber pressure is increased to between about 1 Torr and about 10 Torr, such as between about 2 Torr and about 8 Torr, for example about 5 Torr. Exposing a substrate to such a cooling medium for about 10 sec. to about 30 sec, such as about 20 sec., may reduce the substrate temperature by up to 200° C., such as between about 40° C. and about 200° C., or between about 80° C. and about 120° C. The cooling medium is pumped from the chamber at 208, and if the resist layer has not been completely removed at 210, the removal and cooling processes may be repeated.

In one embodiment, the reactive gas is pumped from the chamber before the cooling medium is provided. A valve controlling exhaust to a vacuum pump is opened to maximize evacuation, flow of the cooling medium is started into the chamber, and the valve is then closed to establish pressure. In an alternate embodiment, flow of the cooling medium may be started without opening the valve such that the cooling medium purges the reactive gas from the chamber. The valve may then be closed to raise the chamber pressure and provide faster cooling. Hydrogen ($H_2$), helium (He), argon (Ar), and nitrogen ($N_2$) are exemplary gases that may be used for cooling and purging.

In one embodiment, the gas mixture for forming plasma may include nitrogen ($N_2$) as a carrier and/or a reactant. In such an embodiment, the cooling process may be accomplished by discontinuing plasma energy and flow of all gases except nitrogen, allowing the nitrogen to purge the chamber of reactive species or opening the vacuum throttle valve to pump down the chamber, and closing the vacuum throttle valve to raise the chamber pressure for effective cooling. The plasma treatment may then be repeated by opening the vacuum throttle valve to lower chamber pressure, restarting flow of the reactive gases, and restarting plasma energy.

Substrates having magnetic properties are generally thermally controlled during processing if no change to the magnetic properties is intended. If the substrates are not thermally controlled in connection with the plasma process described above, the substrate temperature increases as energy impinges on its surface. To avoid overheating the substrate, the plasma treatment is continued until the substrate temperature reaches a maximum level. In some embodiments, this temperature level will be reached after a duration of between about 30 seconds and about 240 seconds, such as between about 60 seconds and about 120 seconds, for example about 90 seconds. Such duration may not be sufficient to remove all the resist material from the substrate, so the process may be repeated after the substrate cools. A cooling step such as that described above may be used in a repetitive plasma treatment process comprising exposing the substrate to a plasma, discontinuing the plasma and purging the reactive gas from the chamber, and exposing the substrate to a cooling medium. Depending on the thickness of the resist layer and the energy and duration of the plasma treatment, a number of cycles between about 1 and about 10, such as about 5 cycles, may successfully remove the resist layer without changing the magnetic characteristics of the underlying magnetically susceptible layers.

In some embodiments, the substrate may be cleaned during or after the plasma treatment process. Following the plasma treatment process, with or without intermittent cooling steps, the plasma may be exposed to a cleaning agent such as deionized water, to remove traces of resist material or reaction products of resist material and plasma. The cleaning agent may be applied in a rinse process comprising rotating the substrate and spraying the cleaning agent on the substrate surface. In some embodiments, the cleaning agent may be water ($H_2O$), isopropyl alcohol ($C_3H_7OH$), hydrogen peroxide ($H_2O_2$), or any combination or sequence thereof.

In another embodiment, cleaning may be performed during the plasma treatment process. In one embodiment, the gas mixture may further comprise a cleaning agent such as water vapor. The water vapor may be provided at a volumetric flow rate that is between about 50% and about 150% the volumetric flow rate of the reducing agent or the oxidizing agent. In embodiments wherein the cleaning process is performed after the plasma treatment process, the cleaning process may be performed in the same processing chamber as the plasma treatment process, or in a different processing chamber.

In another embodiment, following the resist stripping process, the substrate may be subjected to a post-treatment process to remove any fluorine residues and/or corrosion of the magnetically active layer or layers. A reducing gas is provided to a chamber containing the substrate or substrates being treated, and the reducing gas reacts with trace fluorine, oxygen, or other surface impurities, scavenging them from the surface. The reducing gas may comprise hydrogen in some embodiments, and may be activated into a plasma in some embodiments. The post-treatment may be performed in the same processing chamber as the resist stripping process, following a purge of fluorine containing species from the chamber, or in a different chamber. In one embodiment, following the plasma resist removal process, flow of the reagent and oxidizing gases may be discontinued while the plasma is maintained from the reducing gas. In another embodiment, following the plasma resist removal process, the plasma may be discontinued and the chamber purged. A reducing agent is then provided and a plasma formed to post-treat the substrate.

Figure 3:
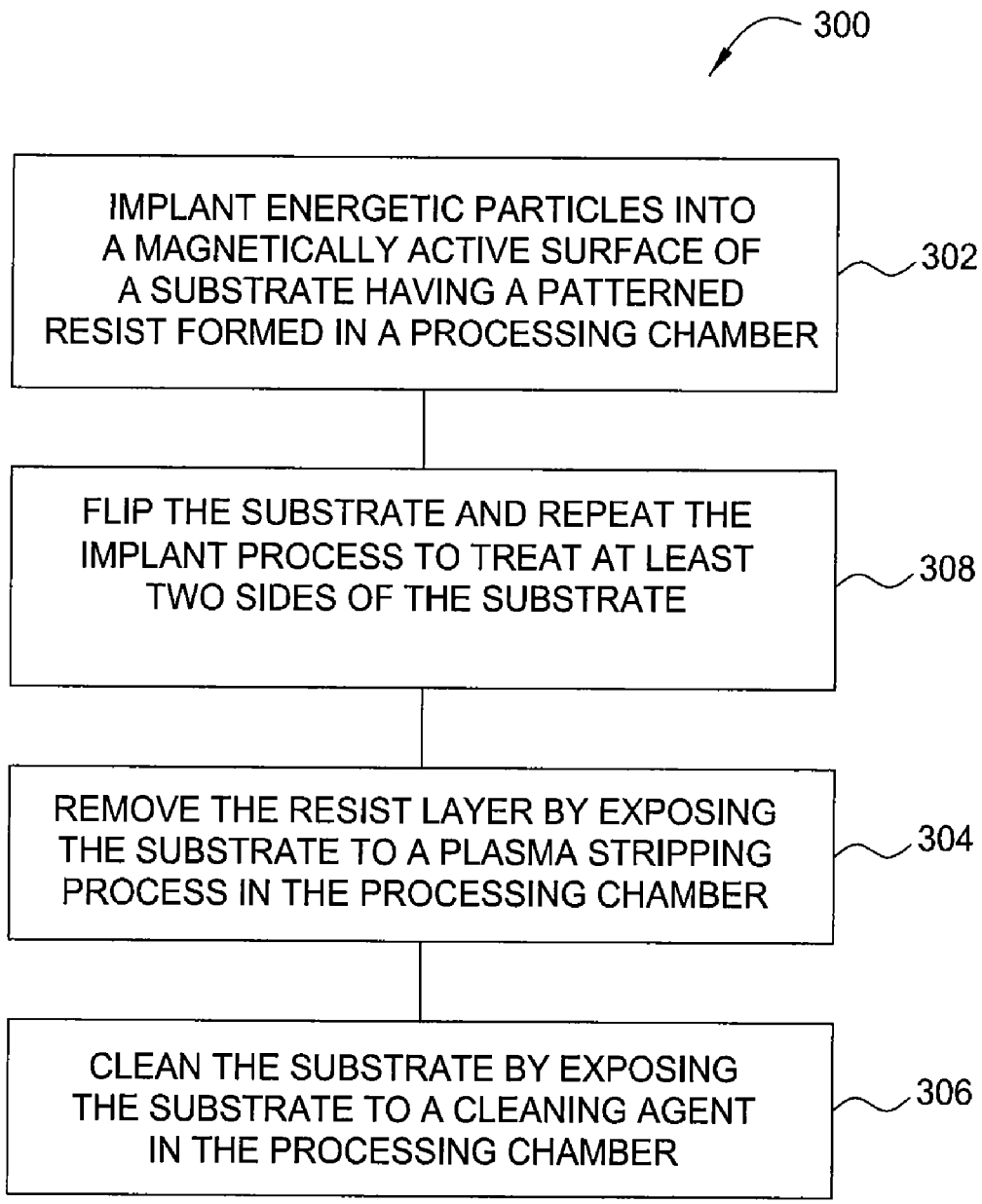
FIG. 3 is a flow diagram summarizing a method according to another embodiment.

The processes described herein are generally used with an overall process for treating substrates having magnetically active layers and surfaces. FIG. 3 is a flow diagram summarizing a method 300 according to another embodiment. In order to make a magnetically active substrate suitable for use in a hard-drive or MRAM application, a magnetically active material is deposited in a layer on a structural substrate to form a substrate having a magnetically active surface. A resist material is formed on the magnetically active surface, and a topographical pattern is developed in the resist material to yield thick portions and thin portions. In some cases, the resist material may be removed in certain areas to expose the magnetically active surface beneath. In some embodiments, the resist material may be patterned before applying it to the substrate by coating a template substrate with a curable resist material, partially curing the resist material, physically transferring the partially cured resist material to the substrate, and finishing the resist curing process.

The substrate is subjected to an implantation process at 302. Ions or other energetic particles are directed toward the magnetically active surface of the substrate. Where the surface is exposed or covered by only a thin layer of resist material, the energetic particles implant into the surface. Where the surface is covered by a relatively thick layer of resist material, the energetic particles implant in the resist material without reaching the magnetically active surface. Where the energetic particles implant into the magnetically active surface, the magnetic characteristics of the surface are changed at that location. A pattern of magnetic characteristics is thus formed in the magnetically active surface of the substrate.

At 308, the substrate is flipped over, and the implant process is repeated to treat at least two sides of the substrate. The flipping may be performed by a robot that enters the chamber, engages the substrate, rotates it 180° about a diametric axis, and replaces it on the substrate support, or the substrate may be moved to another chamber for flipping without breaking vacuum. In other embodiments, a substrate handling module may retrieve substrates processed on a first side from a processing chamber or cluster tool featuring a plurality of processing chambers, flip the substrates, and charge the substrates to the cluster tool for processing on a second side of the substrates.

The resist material, having been subjected to implantation of energetic particles, is removed by exposing the substrate to a plasma resist removal process at 304. The plasma resist removal process may be performed in the same chamber as the implantation process, or in a different chamber without breaking vacuum, such that a substantially continuous vacuum is maintained during the implant process and the plasma stripping process. The plasma resist removal process may be performed substantially as described in connection with FIGS. 1 and 2 above. The substrates may be flipped to remove resist from two sides of the substrate after implanting the two sides of the substrate.

The resist material is substantially removed by the plasma process. Any remaining traces of the resist material, or reaction products of the resist material with the plasma, such as ash particles containing boron, carbon, or fluorine, may be removed using a cleaning process at 306. The substrate is exposed to a cleaning agent such as deionized water, which may be liquid, and the exposure may be performed in the same chamber as the plasma stripping process, or in a different chamber without breaking vacuum, or at atmospheric pressure. In one embodiment, the substrate may be rotated while the cleaning agent is applied. In another embodiment, the cleaning agent may be provided to the chamber as a vapor during the plasma process, either with the plasma itself or during a cooling process, if such a process is used. In one embodiment, water vapor is provided to the chamber during the plasma treatment.

In one embodiment, an aqueous cleaning fluid is used to rinse residues from substrates following a plasma resist removal process. An aqueous solution, which may be a deionized water mixture, and may be maintained at a temperature between about 60° C. and about 100° C., is applied to the newly exposed magnetically susceptible surface of the substrate. Some residual material is dissolved by the rinse, and some is physically removed by the force of the flowing fluid. The aqueous fluid is generally at least slightly conductive, having a conductivity of at least about 40 µS/cm, to avoid galvanic corrosion of the substrate surface. In one embodiment, the aqueous fluid comprises deionized water and a surfactant. In another embodiment, the aqueous fluid has a pH between about 6.0 and about 8.0.

Between the plasma resist removal process and the wet clean process, a dry clean process may be performed by exposing a substrate to a hydrogen containing plasma, for example a plasma formed from $H_2$, or $H_2O$, or both. If a hydrogen containing gas is used during the resist removal process, the dry clean process may be performed by shutting off flow of any reagent or oxidizing gas, maintaining flow of the hydrogen containing gas, and continuing the plasma. It may be advantageous to replace flow of the reagent and/or oxidizing gas, at least in part, with flow of an inert gas to facilitate maintaining the plasma.

The substrate is exposed to the hydrogen containing plasma for a duration between about 1 second and about 60 seconds to perform the dry clean process. Exposure to the hydrogen containing plasma removes a portion of the residual material left after the resist removal process.

The exposure to the hydrogen containing plasma may be performed in the same chamber as the resist removal process, or in a different chamber. In one embodiment, a plurality of plasma chambers is coupled to a transfer chamber to form a cluster tool, in which at least one of the plasma chambers is a resist removal chamber in which a dry resist removal process and a dry clean process are performed sequentially.

Figure 4:
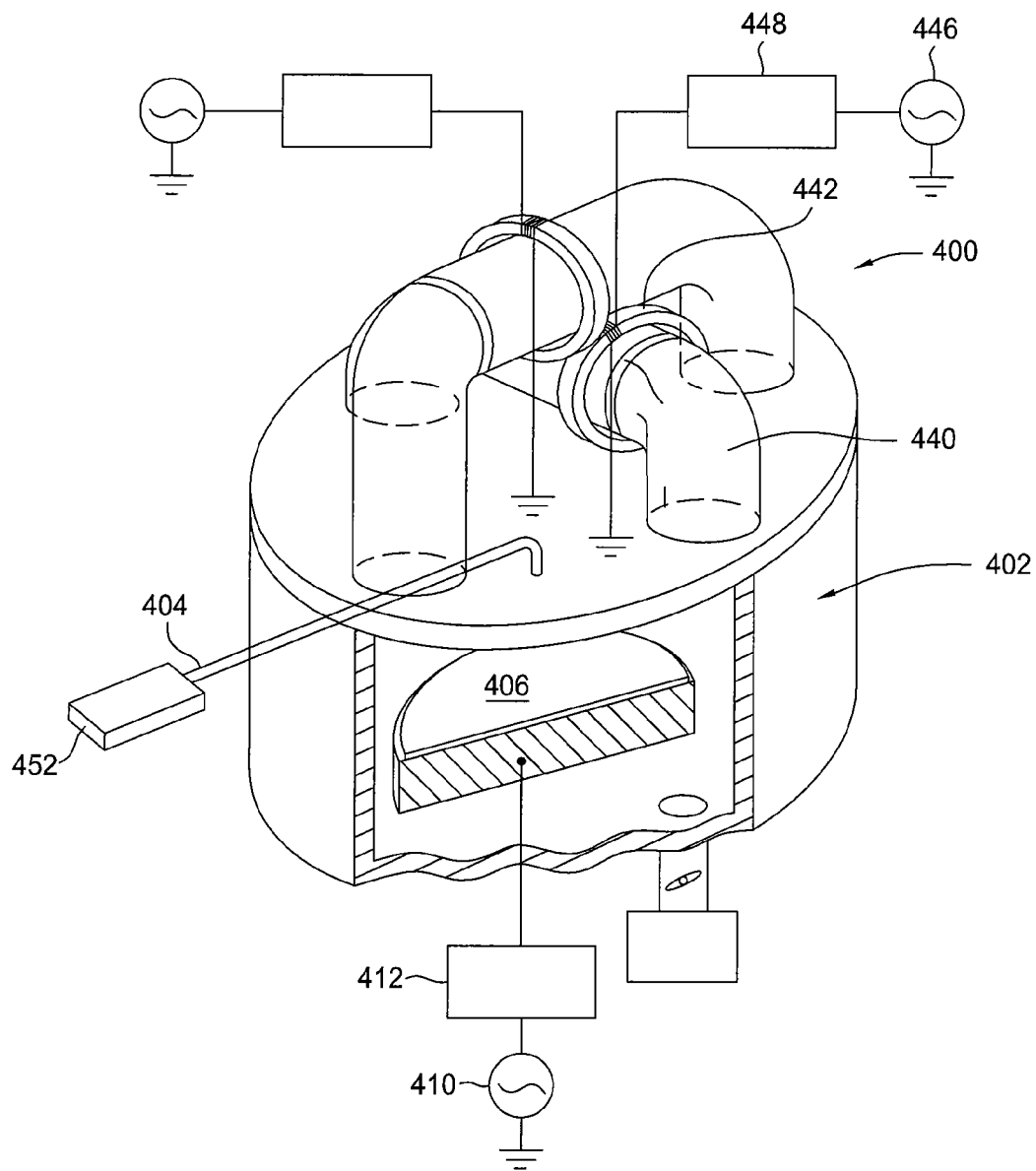
FIG. 4 is a perspective view of an apparatus according to another embodiment.

FIG. 4 is an isometric drawing of a chamber 400 useful for practicing embodiments of the invention. The chamber 400 of FIG. 4 is a P3I chamber, available from Applied Materials, Inc., of Santa Clara, Calif., which may be used to practice the resist removal processes described herein. The processing chamber 400 includes a chamber body 402 with a substrate support 406 disposed therein. Process gases are provided to the chamber body 402 through a conduit 404 coupled to one or more gas sources 452. A pair of re-entrant conduits 440, coupled to a lid region of the chamber body 402, provides a plasma source for the chamber 400. An inductive coil 442 disposed around each re-entrant conduit 440 is coupled to a respective RF source 446 through an impedance match device 448. The inductive coils 442 form respective plasmas inside each re-entrant conduit 440 by creating a magnetic field inside gas flowing through the re-entrant conduits 440. The energized gas flows into the chamber body 402 and interacts with a substrate disposed on the substrate support 406. The substrate support 406 may be biased using a bias generator 410 coupled to the substrate support through a bias impedance match device 412.

The chamber 400 may be modified to practice various embodiments described herein by adding gas sources 452 and piping and valves to deliver each gas source 452 to the chamber 400. The process gas sources 452 may include sources of fluorine, for example $CF_4$, $NF_3$, and/or $SiF_4$, oxygen, hydrogen, nitrogen, carbon, inert gases such as argon, and vapor phase cleaning agents such as water, isopropanol, or hydrogen peroxide. Sources of any of the compounds or mixtures described above for the methods of FIGS. 1-3 may be provided.

In some embodiments, a plurality of substrates is processed simultaneously. The substrates may be positioned on a substrate holder, which is in turn positioned in the processing chamber for treatment. In one embodiment, up to 14 substrates may be positioned on a substrate holder and processed in a processing chamber simultaneously.

Implant resist was removed from a substrate by exposing the substrate having a photoresist layer to a plasma gas mixture of 400 sccm $CF_4$, 100 sccm $H_2$, and 100 sccm $O_2$, at a pressure of 70 mTorr for 120 sec, the plasma formed by energizing the plasma gas mixture with 1000 W of RF power applied to an inductive plasma source. No bias was applied to the substrate. The plasma treatment was followed by a deionized water wash at 100° C. for 60 seconds. Implant resist was removed from a second substrate using the above plasma treatment conditions and omitting the deionized water wash post-treatment. Magnetic properties of the substrate, including a magnetic pattern formed on the substrate surface, were substantially unchanged by the resist removal process.

While the foregoing is directed to embodiments of the invention, other and further embodiments of the invention may be devised without departing from the basic scope thereof.

What is claimed is:

1. A method of removing a resist layer from a magnetically active substrate, comprising:
   providing a gas mixture comprising a reagent gas comprising fluorine, an oxidizing gas, and a reducing gas to a processing chamber;
   forming an inductive plasma from the gas mixture by applying energy selected from the group consisting of RF energy, pulsed DC energy, and microwave energy to the gas mixture; and
   etching the resist layer by immersing the magnetically active substrate in the plasma.

2. The method of claim 1, wherein a bias voltage less than about 50 V is applied to the substrate.

3. The method of claim 1, further comprising discontinuing the plasma, purging the processing chamber with an inert gas, and repeating providing the gas mixture, forming the inductive plasma, and etching the resist layer.

4. The method of claim 1, wherein the gas mixture further comprises a cleaning agent.

5. The method of claim 1, wherein the gas mixture comprises a fluorocarbon, hydrogen ($H_2$), and oxygen ($O_2$).

6. The method of claim 5, further comprising thermally controlling the magnetically active substrate by flowing a cooling gas through the processing chamber.

7. The method of claim 6, further comprising exposing the magnetically active substrate to a cleaning agent.

8. The method of claim 7, wherein the cleaning agent is selected from the group consisting of water vapor provided during the plasma exposure process and liquid water provided after the plasma process.

9. A method of processing a substrate having a magnetically active layer and a resist layer contacting the magnetically active layer, the method comprising:
   applying energy selected from the group consisting of RF energy, pulsed DC energy, and microwave energy to a gas mixture comprising fluorine to form a plasma; and
   exposing the resist layer to the plasma while maintaining the magnetic characteristics of the magnetically active layer in a substantially unchanged state.

10. The method of claim 9, wherein the gas mixture comprises a reagent, a reducing agent, an oxidizing agent, and a cleaning agent, and the energy is RF energy.

11. The method of claim 9, further comprising treating the substrate with hydrogen or a hydrogen containing plasma.

12. The method of claim 10, wherein the reagent is a fluorine containing substance, the reducing agent is a hydrogen containing substance, the oxidizing agent is an oxygen containing substance, and the cleaning agent is a solvent.

13. The method of claim 10, wherein the plasma process comprises:
   exposing the substrate to the plasma;
   discontinuing the plasma and purging the processing chamber;
   exposing the substrate to an inert gas; and
   repeating the exposing the substrate to the plasma, discontinuing the plasma, purging the processing chamber, and exposing the substrate to an inert gas.

14. The method of claim 13, wherein the plasma process further comprises cooling the substrate by increasing a pressure of the inert gas in the processing chamber while exposing the substrate to the inert gas.

15. The method of claim 9, wherein a plurality of substrates is processed concurrently.

16. The method of claim 15, further comprising flipping the plurality of substrates and processing at least two sides of the plurality of substrates.

17. A method of processing a substrate in a processing chamber, the substrate having a magnetically active layer and a resist layer disposed thereon, the method comprising:
 implanting ions into the magnetically active layer and the resist layer;
 performing a resist removal process on the substrate, the resist removal process comprising:
  immersing the substrate in a plasma at a first pressure, the plasma comprising one or more elements from the group consisting of fluorine and nitrogen;
  applying a bias energy between about 0 W and about 100 W to the substrate;
  discontinuing the plasma and purging the processing chamber;
  exposing the substrate to a non-reactive gas at a second pressure greater than the first pressure;
  purging the non-reactive gas from the processing chamber; and
  repeating the resist removal process until the resist layer is removed; and
 exposing the substrate to a cleaning agent, wherein the implanting, repeated resist removal process, and exposure to the cleaning agent are performed in the same processing chamber.

18. The method of claim 17, wherein the plasma is formed by applying RF energy to a gas mixture comprising a fluorocarbon, a hydrogen containing compound, and an oxygen containing compound.

19. The method of claim 18, wherein the cleaning agent is selected from the group consisting of water, isopropyl alcohol, and hydrogen peroxide.

* * * * *